March 29, 1966 G. B. STRACCA 3,243,720
AMPLIFIER WITH TUNNEL DIODE
Filed May 22, 1962 3 Sheets-Sheet 1

INVENTOR.
Giovanni Battista Stracca
BY
Stevens, Davis, Miller & Mosher
ATTORNEYS March 29, 1966 G. B. STRACCA 3,243,720

AMPLIFIER WITH TUNNEL DIODE

Filed May 22, 1962 3 Sheets-Sheet 2

INVENTOR.

Giovanni Battista Stracca

BY

Stevens, Davis, Miller & Mosher

ATTORNEYS

INVENTOR.
Giovanni Battista Stracca
BY
Stevens, Davis, Miller & Mosher
ATTORNEYS

United States Patent Office 3,243,720

Patented Mar. 29, 1966

3,243,720

AMPLIFIER WITH TUNNEL DIODE

Giovanni Battista Stracca, Milan, Italy, assignor to Marelli-Lenkurt S.p.A., Milan, Italy, a corporation of Italy Filed May 22, 1962, Ser. No. 196,753

Claims priority, application Italy, May 22, 1961, 9,365/61

8 Claims. (Cl. 330—61)

Present invention refers to an amplifier for microwaves with tunnel diodes and more particularly to amplifiers using the differential negative resistance of these diodes.

The use of diodes with tunnel effect in amplifiers for microwaves has many practical difficulties and first of all that one of biasing in a stable way the diode in any predetermined point in the region of its negative current-voltage characteristic.

The diode is to be connected to an external circuit having an impedance in the desired amplification band and allowing moreover the application to the diode of the bias voltage.

Since the diode in its negative resistance region presents a negative resistance for all frequencies below the diode cutoff frequency, it is rather difficult, and increasingly so for diode having very high cutoff frequencies, to design this external circuit so as not to initiate oscillations at any frequency below cutoff. These undesired oscillations may arise due to the phenomena of relaxation oscillations, or of diode switching between two stable states of bias outside of the zone of the diode's maximum negative resistance slope.

Till today the problem of parasitic oscillation firing has not proved insurmountable, as the first tunnel diodes embodied for microwaves had such cut-off frequencies, which were not much higher than those for possible operation and therefore it was enough to connect the diode to a resonator for microwaves which should not have higher modes of oscillation between the operation frequency and the cut-off frequency, said resonator being designed carefully together with the bias circuit in such a way as not to cause possible relaxation oscillations or switching phenomena.

The difficulties increase and become practically insurmountable, when th ediode has a very low negative resistance with respect to the characteristic standard impedances of the transmission lines that are conventionally used in the microwave field and to which the amplifiers are to be connected; and when in order to provide a low noise amplifier, it is desired to use diodes with very high cut-off frequencies notably higher than the amplifier's operating frequency, these diodes being in development at the present time.

Present invention has the purpose of utilizing the negative differential resistance of these diodes to embody a tunnel diode amplifier for microwaves having a diode bias circuit and a microwave circuit, which does not allow undesirable instability phenomena even with diodes at a very low negative resistance or with a very high cut-off frequency.

Present invention is characterized in that the external circuit as connected to the tunnel diode has at the terminals thereof a constant and resistance impedance for all of the frequencies lower than the diode cut-off frequency, including the direct current in such a way that the bias voltage as well as the signal to be amplified can be applied to the diode.

It is very usful to embody a circuit having a resistive and constant impedance connected to the tunnel diode, as it can be proved that there are such value ranges of this resistance, which are a function of the diode circuit parameters, whereby no instability phenomenon of any kind is possible.

The connection of the diode external circuit by means of a reactive element in series might be suitable, said reactive element having an inductive character for all of the frequencies lower than the diode cut-off frequency.

In general the external circuit embodying the constant resistance can be considered as a three terminal-pair network, a terminal pair of which is connected to the tunnel diode, another terminal pair is connected to the generator of the continuous bias voltage and a third terminal pair to the generator of the signal, to be amplified through a suitable non-reciprocal circuit.

The invention will be illustrated by way of example only with reference to the accompanying drawings, which show a preferred embodiment of the external circuit as achieved by means of a transmission line.

Figure 1:
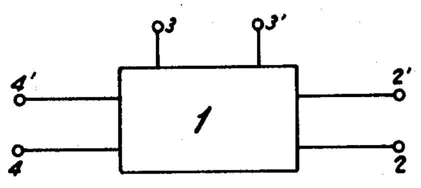
FIG. 1 shows the external circuit as a three terminal pair network.

With reference to FIG. 1, 1 indicates the three terminal-pair network embodying the diode external circuit with constant resistive impedance, comprising the insertion circuit of the signal to be amplified as well as the transmission line. The terminal pairs 2, 2', 3, 3' and 4, 4' are to be respectively connected to the generator of the continuous bias voltage, to the generator of the signal to be amplified through a suitable non-reciprocal circuit and to the tunnel diode. In the connection to the signal generator, the non-reciprocal circuit can be realized by a circulator and the connection to the diode terminals can take place by means of a suitable reactive element in series.

These generators, the non-reciprocal circuit and the diode are not shown in FIG. 1.

Figure 2:
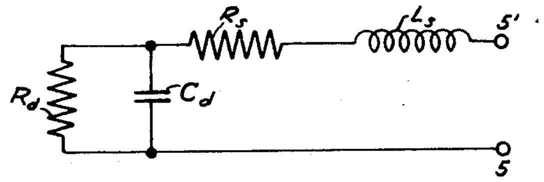
FIG. 2 shows the equivalent circuit of a tunnel diode.

In the diode diagram of FIG. 2, $R_d$ is the differential resistance which is a function of the voltage, said differential resistance becoming negative in a suitable bias region; $C_d$ is the connection capacity in parallel to said differential resistance, which is also a function of the voltage; $R_s$ is the wafer resistance; and $L_s$ is the container inductance. $R_s$ and $L_s$ are in series with each other and in parallel to $R_d$ and $C_d$. By closing this equivalent circuit on a constant resistance impedance R, it can be proved that to prevent instability phenomena, R must have such a value, that $$\frac{R_s+R}{R_d}$$

be always comprised between:

$$1>\frac{R+R_s}{R_d}>\frac{L_s}{C_d}\frac{1}{R_d^2} \tag{I}$$

Figure 3:
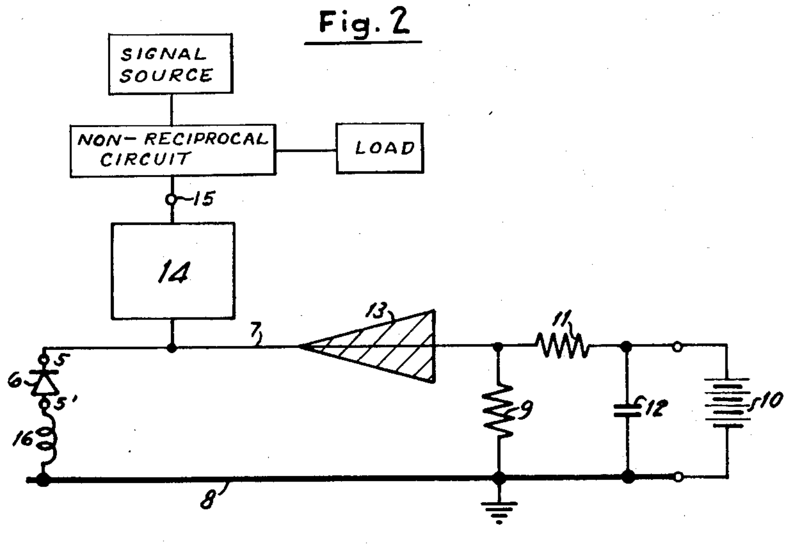
FIG. 3 is a diagram of an amplifier for microwaves with tunnel diode, wherein the insertion circuit of the signal to be amplified is coupled to the transmission line connected at its ends to the diode and bias voltage generator, respectively.

The transmission line 7, 8 as shown in FIG. 3 realizes one embodiment of the external circuit connected to the tunnel diode. Said diode indicated with the reference numeral 6 forms a terminal of such a line, where only a propagation of the principal or TEM mode (for example, a coaxial line or a shielded strip line) can take place for all of the frequencies lower than the diode cut-off frequency and whose characteristic impedance is chosen in such a way as to meet with the required stability and amplification conditions.

Said transmission line terminates at the other extremity with a terminating resistance 9, the value of which is equal to the characteristic impedance of the transmission line itself so that the desired bias voltage can be applied to the middle lead 7 thereof and therefore to the diode 6. To this purpose the generator 10 of such a voltage is connected accordingly to middle lead 7 through a resistance 11, which is great enough as not to alter appreciably the whole value of the transmission line closing resistance 9. The terminal of said resistance 11 connected to the middle lead 7 is also connected to the resistance 9. A suitable by-pass and protection capacitor 12 is inserted between the shield (ground) lead 8 and resistance 11 at the terminal connected to the bias voltage generator 10. Said elements 9, 11 and condenser 12 form a network which enables the application of bias voltage to diode 6, and acts as a practically constant resistance equal to the characteristic impedance of the transmission line from D.C. to the frequency for which the components constituting said network are still operating as lumped constant elements having the same values as at the lower frequencies. This frequency limit is generally of some hundreds of megacycles but with suitably selected components as for example disc resistances it can be increased.

A microwave attenuator 13, having a sufficiently high attenuating value, is inserted in the transmission line ahead of the resistance 9 in order to insure that at the higher frequencies where the lumped constant elements are no longer effective, the transmission line will be terminated on its characteristic impedance. It is enough of course that this happens at least till the diode cut-off frequency. The means for the application to the diode of the signal to be amplified and to take therefrom the amplified signal without alteration of the constant diode terminating impedance are coupled to the transmission line. The signal to be amplified is applied to the tunnel diode through any kind of selective directional circuit with constant resistance 14 used in the microwave field, that is a circuit having the feature of a constant resistance at all frequencies. This selective circuit is to be inserted between diode 6 and attenuator 13.

The inlet terminal of this selective filter circuit to which the amplification signal is applied, is indicated with 15. As the tunnel diode must have a mere resistance at the frequency of the signal to be amplified to the purpose of reaching the maximum amplification, then a reactive induction element 16 is connected in series to the transmission line, said reactive induction element 16 operating at the frequency to be amplified as an inductance L of such value, that it resonates with the inductance $L_s$ and capacitive $C_d$ of the tunnel diode itself. This inductance L can be considered as combined together with an inductance $L_s$ for the stability purpose. The stability condition (I) takes in such a case a more general character, that is:

$$\text{(II)} \qquad 1>\frac{R+R_s}{R_d}>\frac{L_s+L}{C_d}\,\frac{1}{R_d^2}$$

The value L of inductance 16 as a function of the diode parameters and frequency $\omega$ of the signal to be amplified is as follows:

$$\text{(III)} \qquad L=\frac{C_dR_d^2}{1+\omega^2C_dR_d^2}-L_s$$

Said reactive element is to be embodied in such a way as to maintain always its inductance characteristics for all of the frequencies lower than the diode cut-off frequency. It might be suitable to embody in practice this reactive element in such a way that the regulation thereof be possible. To obtain a sufficiently high ratio of amplification, the value of the constant resistance R presented by the external circuit connected to the diode, should be only slightly less than the absolute value of the negative resistance presented by the tunnel diode at its terminals 5, 5', at the frequency of the signal to be amplified. More specifically, R as a function of the desired power amplification A must be as follow:

$$\text{(IV)} \qquad \left(R=\frac{R_d}{1+\omega^2C_d^2R_d^2}-R_s\right)\frac{\sqrt{A}+1}{\sqrt{A}-1}$$

This can be achieved by carefully selecting the characteristic impedance of line 7, 8 so as to be equal to said value R.

Figure 4:
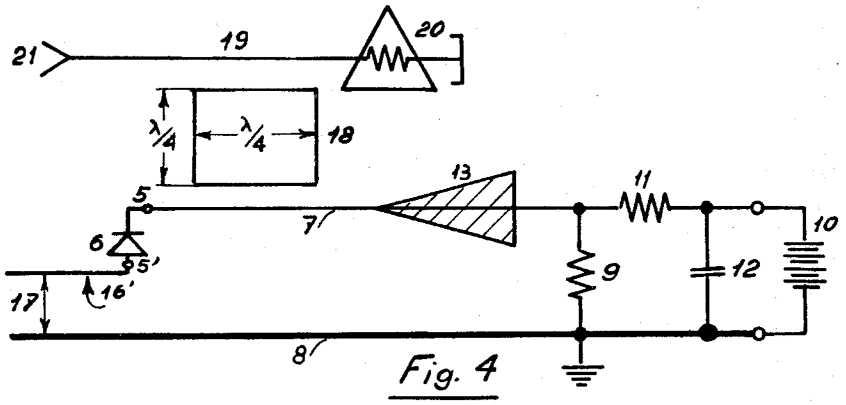
FIG. 4 shows a diagram of the amplifier according to FIG. 3 with a particular signal insertion circuit.

FIG. 4 is a diagrammatic embodiment of circuit shown in FIG. 3, wherein the selective directional filter with constant resistance for the signal insertion is realized through a travelling wave resonant circuit and the inductance of a value given by (III) is achieved by means of a very little length of line 16' with suitable characteristic impedance and smaller than a quarter-wavelength at the diode cut-off frequency. This line 16' being in series to tunnel diode 6 and shortcircuited through slider 17 at the opposite extremity in such a way to form together with said tunnel diode the termination of the transmission line 7, 8.

The travelling wave resonator is constituted by a loop transmission line 18 of about a wavelength at the frequency of the signal to be amplified and coupled to the transmission line 7, 8 for about a length ¼λ in such a way as to achieve a direct coupling and another length thereof is coupled also for about a length ¼λ to another transmission line 19 terminated by a load resistance 20. This resistance is equal to thec haracteristic impedance of this line, the inlet terminal 21 of which forms the inlet of the signal to be amplified.

Figure 5:
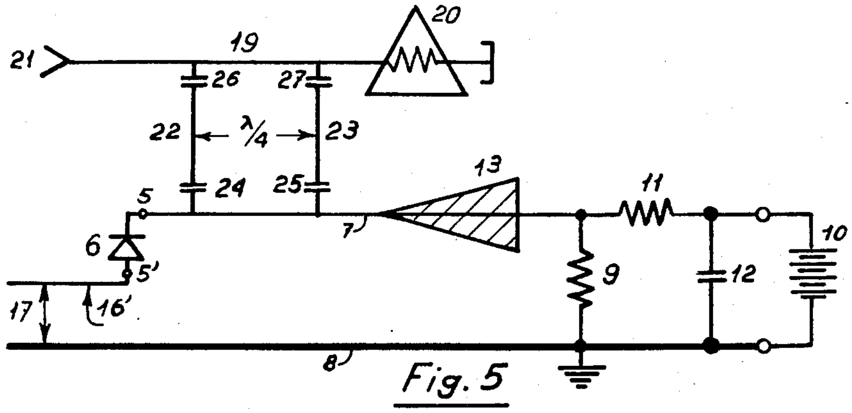
FIG. 5 illustrates another diagram of the amplifier according to FIG. 3 with a different signal insertion circuit.

FIG. 5 shows another diagrammatic embodiment of FIG. 3 with respect to the selective directional filter with constant resistance. Said filter is realized by means of two resonators constituted by two equal line lengths 22 and 23, each having a length smaller than a half-wavelength at the signal frequency, said line lengths 22 and 23 embodying through capacities 24, 25 a capacitive coupling to lead 7 of transmission line 7, 8 in two points spaced from one another by λ/4 in a region comprised between tunnel diode 6 and microwave attenuator 13.

Coupling of this resonator to another transmission line such as 19 in FIG. 4 takes place also at the other extremity by means of two capacities 26 and 27 again at two points that are spaced from one another by a length λ/4.

It might be suitable for practical purposes to provide transmission line 7, 8 with such means as to allow a small variation of its characteristic impedance for performing some regulation of the obtainable amplification and to take into due account the variations of circuit parameters from one to another diode unit. The amplifiers of FIG. 4 and 5 are shown in a practical embodiment form in FIGURES 6 and 7, respectively, wherein like references with prime marks indicate the same parts of FIGS. 4 and 5.

The tunnel diode 6' is connected at a termination for a transmission line 7', 8', of the shielded stripline type, in series with a small length of line 16" terminated by a short circuiting slider 17' for the regulation of the operating frequency. The line length between the short circuit and the tunnel diode is very small, being less than a quarter of a wave length at the tunnel diode cut off frequency.

The characteristic impedance of strip line is chosen of a value corresponding to (IV) for the purpose of preventing instability phenomena and to have the desired amplification. This strip line is closed on disc resistance 9' equal to the characteristic impedance of the strip line. The microwave attenuator 13' embodied by means of dissipative material is connected before disc resistance 9', said attenuator 13' being suitably shaped for the purpose of preventing reflections at the microwave frequencies, for which it is effective.

The bias voltage of said tunnel diode is applied to terminal 28, which is connected to inner lead 7' of strip line and to disc resistance 9' through resistance 11'. A button condenser 12' is connected to terminal 28 and resistance 11' to achieve a radio-frequency by-pass towards outer shield 8'.

Figure 6:
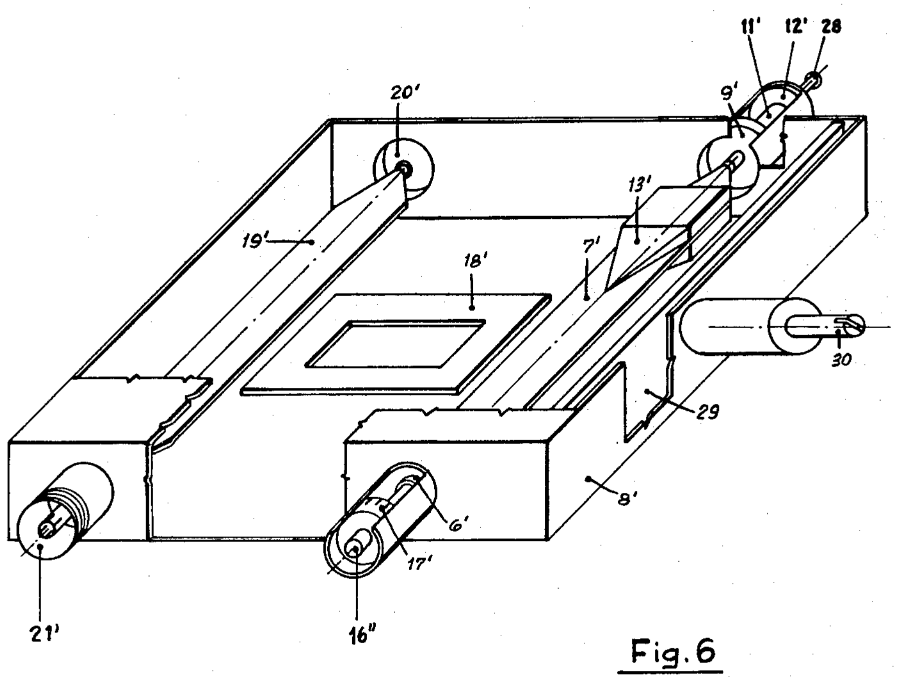
FIG. 6 shows an embodiment of the amplifier as illustrated in diagram of FIG. 4

In FIG. 6 the directional filter connected between tunnel diode 6' and microwave attenuator 13' is embodied by a travelling wave resonator constituted by a loop strip line 18'.

Said strip line is coupled electromagnetically for a length $\lambda/4$ to lead 7' of strip line 7', 8'. In a like way it is coupled to another strip line 19' terminating on disc resistance 20' equal to the characteristic impedance of this line. Terminal 21' constitutes the amplifier inlet terminal.

Figure 7:
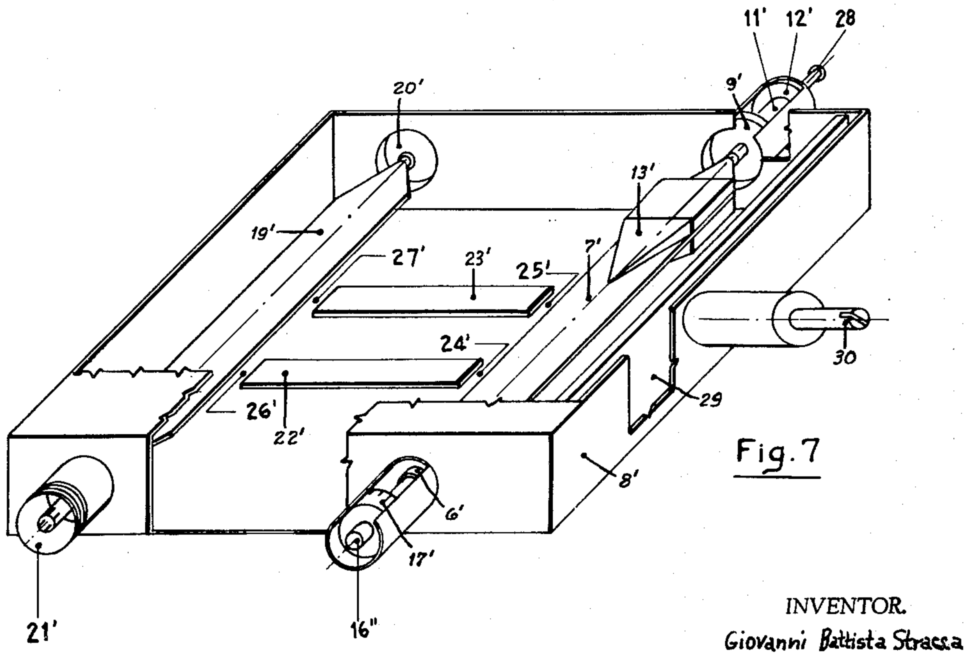
FIG. 7 shows an embodiment of the amplifier as represented in diagram of FIG. 5.

In FIG. 7, the directional filter is embodied by two line lengths 22', 23' of a suitable length smaller than a half wavelength at the signal frequency and coupled in a capacitive way through two capacitive couplings 24' and 25' to lead 7' of transmission line 7', 8' and by means of two other capacitive couplings 26', 27' to the other transmission line 19' also of the shielded strip line type. In a like way said second line terminates on the disc resistance 20' equal to the characteristic impedance of line 19'. A regulation of the characteristic impedance of line 7', 8' by displacement of the side wall of shield 29 through the adjusting screw 30 is provided for the purpose of taking into due account the small variations in the characteristics between one tunnel diode and another, and to achieve in such a way the desired amplification.

Present invention refers only to a particular embodiment thereof. It is to be understood however, that present disclosure is only by way of a non limiting example of all embodiments included in the spirit and scope of this invention. Moreover, it is to be understood that what above referred to in respect to tunnel diode can be substantially applied to other components having a negative resistance.

I claim:

1. In a microwave system, in combination:

a source of signals at microwave frequencies, a negative resistance amplifier, a load, and non-reciprocal circuit means for coupling signals from said source to said amplifier and amplified signals from said amplifier to said load, said amplifier comprising:

a negative resistance device having a predetermined cutoff frequency, biasing circuit means for biasing said device to a particular magnitude of negative resistance, constant impedance directional filter means for providing input and return signal coupling between said device and said non-reciprocal circuit means for signals in a selected band of frequencies and for providing a direct current connection between said biasing circuit means and said device, said directional filter means including a transmission line section having a predetermined characteristic impedance of magnitude less than said magnitude of negative resistance, on end of said transmission line being connected to said device, the other end of said transmission line being connected to said biasing circuit means, and impedance means for terminating said other end of said transmission line section on its characteristic impedance for all frequencies below said cutoff frequency.

2. The combination in a microwave system according to claim 1, wherein said impedance means includes a microwave attenuator mounted on said transmission line section and a resistance element being connected to said other end of said transmission line section and having a magnitude of resistance equal to said predetermined characteristic impedance.

3. The combination in a microwave system according to claim 1, wherein said biasing circuit means comprises a source of direct current, a resistor connecting said direct current source to said other end of said transmission line section, and a capacitor shunted across said source to prevent said signals at microwave frequencies from passing through said direct current source.

4. The combination in a microwave system according to claim 1, wherein said amplifier further comprises reactive tuning means serially connected with said device, said device with said tuning means thereby acting substantially as a pure resistance at the frequencies of said selected band of signals.

5. The combination in a microwave system according to claim 4, wherein said inductive means is a transmission line section having a length less than a quarter wavelength at said frequencies and being connected at one end to said negative resistance device and short-circuited at the other end.

6. The combination in a microwave system according to claim 1, wherein said constant impedance directional filter means further includes a second transmission line section having a first and a second end and a characteristic impedance equal to said predetermined characteristic impedance, said first end being connected to said non-reciprocal circuit and said second end being terminated on said predetermined characteristic impedance, and resonating circuit means for coupling signals in said selected band of frequencies between said second transmission line and said first transmission line.

7. The combination in a microwave system according to claim 6 wherein said resonating circuit means is a traveling wave resonator comprising a loop transmission line having a length substantially equal to a multiple of the wavelength of the middle frequency in said selected band of frequencies, said loop transmission line being electromagnetically coupled to said first transmission line section throughout a first section having a length substantially equal to one-quarter of said wavelength and to said second transmission line section throughout a second section substantially equal to one-quarter of said wavelength.

8. The combination in a microwave system according to claim 7, wherein said resonating circuit means is a pair of strip resonators spaced from each other by a means distance equal to one-quarter of the wavelength of the middle frequency in said selected band of frequencies, each of said resonators comprising a transmission line section having a length less than one-half of said wavelength and being capacitively coupled to said first transmission line section at one end and to said second transmission line section at the other end.

References Cited by the Examiner

UNITED STATES PATENTS

| | | | |
|---|---|---|---|
| 2,978,576 | 4/1961 | Watters. | |
| 3,187,266 | 6/1965 | Marshall | 330—34 |

ROY LAKE, *Primary Examiner.*

N. KAUFMAN, *Assistant Examiner.*